(12) United States Patent
Zhao

(10) Patent No.: US 9,614,051 B2
(45) Date of Patent: *Apr. 4, 2017

(54) SEMICONDUCTOR DEVICES AND FABRICATION METHOD THEREOF

(71) Applicant: Semiconductor Manufacturing International (Shanghai) Corporation, Shanghai (CN)

(72) Inventor: Jie Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/716,886

(22) Filed: May 20, 2015

(65) Prior Publication Data

US 2015/0380519 A1    Dec. 31, 2015

(30) Foreign Application Priority Data

Jun. 30, 2014 (CN) .......................... 2014 1 0308810

(51) Int. Cl.
*H01L 29/66* (2006.01)
*H01L 29/51* (2006.01)
(Continued)

(52) U.S. Cl.
CPC .... *H01L 29/66545* (2013.01); *H01L 21/0262* (2013.01); *H01L 21/02164* (2013.01); *H01L 21/02271* (2013.01); *H01L 21/02318* (2013.01); *H01L 21/02529* (2013.01); *H01L 21/02532* (2013.01); *H01L 21/02576* (2013.01);
(Continued)

(58) Field of Classification Search
CPC ............ H01L 21/324; H01L 21/26586; H01L 21/28176; H01L 29/41775; H01L 29/495; H01L 29/66545; H01L 21/28247; H01L 29/517

See application file for complete search history.

(56) References Cited

U.S. PATENT DOCUMENTS 6,436,799 B1 *  8/2002  Ramkumar ....... H01L 21/28176
                                                 257/E21.194
9,190,481 B2 * 11/2015  Zhao .................... H01L 29/495
(Continued)

*Primary Examiner* — Jerome Jackson, Jr.
*Assistant Examiner* — Fang-Xing Jiang
(74) *Attorney, Agent, or Firm* — Anova Law Group, PLLC

(57) ABSTRACT

A method for fabricating a semiconductor device includes providing a substrate; and forming at least one dummy gate structure on the substrate. The method also includes forming doping regions in the substrate at both sides of the dummy gate structure; forming an interlayer dielectric layer on the d the dummy gate structure; performing a first step thermal annealing process to increase a density of the interlayer dielectric layer; and activating doping ions for a first time without an excess diffusion of the doping ions in the doping region; and removing the dummy gate structure to expose the surface of the substrate to form a trench in the annealed interlayer dielectric layer. Further, the method also includes forming a gate dielectric layer on the surface of the substrate on bottom of the trench; and performing a second step thermal annealing process to activate the doping ions for a second time.

19 Claims, 6 Drawing Sheets

(51) Int. Cl.
*H01L 29/78* (2006.01)
*H01L 29/165* (2006.01)
*H01L 21/324* (2006.01)
*H01L 21/02* (2006.01)
*H01L 29/49* (2006.01)

(52) U.S. Cl.
CPC .. *H01L 21/02579* (2013.01); *H01L 21/02639* (2013.01); *H01L 21/324* (2013.01); *H01L 29/165* (2013.01); *H01L 29/495* (2013.01); *H01L 29/4966* (2013.01); *H01L 29/4975* (2013.01); *H01L 29/517* (2013.01); *H01L 29/518* (2013.01); *H01L 29/6656* (2013.01); *H01L 29/7848* (2013.01)

(56) References Cited

U.S. PATENT DOCUMENTS

| | | | | |
|---|---|---|---|---|
| 2010/0270627 | A1* | 10/2010 | Chang | H01L 21/28247 257/411 |
| 2011/0227144 | A1* | 9/2011 | Yin | H01L 21/26586 257/327 |
| 2012/0309158 | A1* | 12/2012 | Hung | H01L 21/324 438/301 |
| 2013/0157431 | A1* | 6/2013 | Tsai | H01L 29/66545 438/299 |
| 2016/0087076 | A1* | 3/2016 | Chiang | H01L 29/41775 438/299 |

* cited by examiner

SEMICONDUCTOR DEVICES AND FABRICATION METHOD THEREOF

CROSS-REFERENCES TO RELATED APPLICATIONS

This application claims the priority of Chinese patent application No. 201410308810.3, filed on Jun. 30, 2014, the entirety of which is incorporated herein by reference.

FIELD OF THE INVENTION

The present invention generally relates to the field of semiconductor manufacturing technology and, more particularly, relates to semiconductor devices and fabrication techniques thereof.

BACKGROUND

Metal-Oxide-Semiconductor Field-Effect Transistors (MOSFETs) are the major semiconductor devices in Integrate Circuits (ICs), especially in Ultra-Large-Scale Integrations (ULSIs). With the rapid development of the fabrication techniques of ICs, the technical node of the semiconductor technology has continuously decreased; and the feature size of the semiconductor devices follows the Moore's law. When the size of the semiconductor devices shrinks to a certain scale, secondary effects also continuously emerge because of various physical limitations; and it may be more and more difficult to reduce the feature size of the semiconductor devices according to a certain ratio. For example, in the field of semiconductor manufacturing, how to solve the large leakage current issue of the semiconductor devices is one of the current major challenges when reducing the size of the semiconductor devices.

The large leakage current issue of the semiconductor devices is caused by the continuous shrinking of the thickness of the traditional gate dielectric layer made of silicon oxide. One of the solutions is to substitute the traditional silicon oxide gate dielectric layer with a high dielectric constant (high-K) material. Further, a metal material is used as the gate electrode material to avoid the Fermi-level pinning effect and the boron penetration happing between the high-K gate dielectric layer and the traditional gate electrode material. Such a gate structure may be referred as a high-K metal gate (HKMG) structure.

Although the introduction of high-K dielectric material and the metal gate material is able to reduce the leakage current of the semiconductor devices to a certain extent, the electrical properties and the reliability of the semiconductor devices need further improvements. The disclosed device structures and methods are directed to solve one or more problems set forth above and other problems.

BRIEF SUMMARY OF THE DISCLOSURE

One aspect of the present disclosure includes a method for fabricating a semiconductor device. The method includes providing a substrate; and forming at least one dummy gate structure on a surface of the substrate. The method also includes forming doping regions in the surface of the substrate at both sides of the dummy gate structure; and forming an interlayer dielectric layer on the surface of the substrate and side surfaces of the dummy gate structure. Further, the method includes performing a first step thermal annealing process onto the interlayer dielectric layer and the doping regions to increase the density of the interlayer dielectric layer and activate doping ions in the doping regions for the first time without causing an excess diffusion of the doping ions in the doping region; and removing the dummy gate structure to expose the surface of the substrate to form a trench in the annealed interlayer dielectric layer. Further, the method also includes forming a gate dielectric layer on the surface of the substrate on bottom of the trench; and performing a second step thermal annealing process onto the gate dielectric layer and the doping regions to activate the doping ions in the doping regions for a second time and increase the density of the density of the gate dielectric layer.

Another aspect of the present disclosure includes a semiconductor device. The semiconductor device includes a substrate; and a high-K metal gate structure having an interface layer formed on a surface of the substrate, a high-K dielectric layer formed on a surface of the interface layer and a gate electrode layer formed on a surface of the high-K dielectric layer. The semiconductor device also includes sidewall spacers formed on side surfaces of the high-K metal gate structure; and doping regions activated by a first step thermal annealing process and a second step thermal annealing process respectively formed in the substrate at both sides of the high-K metal gate structure without causing an excess diffusion of the doping ions in the doping region. Further, the semiconductor device includes a contact etching stop layer covering the surface of the substrate and the side surfaces of the sidewall spacers; and an interlayer dielectric layer with an increased density caused by the first annealing process formed on the surface of the contact etching stop layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
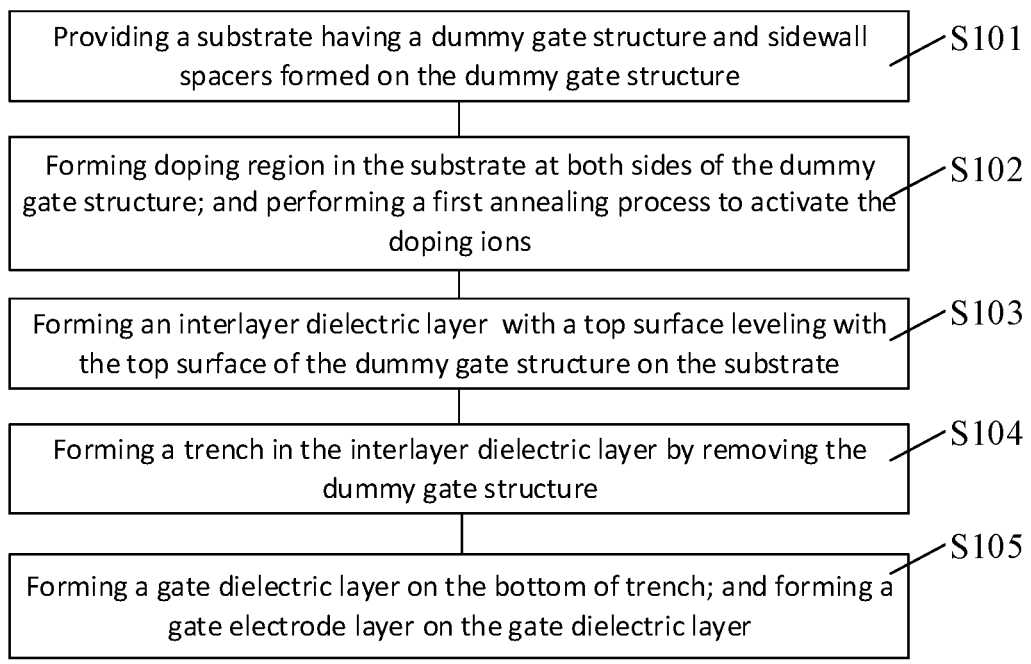
FIG. 1 illustrates an existing fabrication process of a semiconductor device.

FIG. 1 illustrates an existing fabrication process of a semiconductor device. The process includes providing a substrate having dummy gate structures formed on the surface of the substrate and sidewall spacers formed on side surfaces of the dummy gate structures (S101). The process also includes forming doping regions in the substrate at both sides of the dummy gate structure by doping the substrate using the sidewall spacers as a mask; and performing a first thermal annealing process to activate the doping ions in the doping regions (S102). Further, the process includes forming an interlayer dielectric layer leveling with the top surface of the dummy gate structures on the surface of the substrate (S103). Further, the process also includes removing the dummy gate structures to form trenches in the dielectric layer (S104). Further, the process also includes forming a gate dielectric layer on the bottom of the trenches; and forming a gate electrode layer on the surface of the gate dielectric layer to fill the trenches.

The dummy gate structures include a dummy gate dielectric layer and a dummy gate electrode layer formed on the dummy gate dielectric layer; and the dummy gate dielectric layer is made of silicon oxide. In order to obtain a smaller equivalent gate oxide thickness, when the dummy gate structure is removed, the dummy gate dielectric layer is also removed to expose the surface of the substrate on the bottom of the trench. Exposing the surface of the substrate on the bottom of the trench may aid to form an interface layer on the surface of the substrate on the bottom of the trench; and to form a high-K dielectric layer on the interface layer and on the side surfaces of the trench.

With the continuous shrinking of the size of the semiconductor devices, the distance between adjacent dummy gate structures has become smaller and smaller. It has been more and more difficult to form an interlayer dielectric layer on the surface of the substrate between adjacent dummy gate structures; and voids may be formed in the interlayer dielectric layer at the corner between the bottom of the dummy gate structure and the surface of the substrate. In order to lower the difficulties for forming the interlayer dielectric layer; and increase the filling ability of the interlayer dielectric material, a flowable chemical vapor deposition (FCVD) process or a high aspect ratio CVD (HARP CVD) process may be used to substitute the conventional deposition process to form the interlayer dielectric layer, and a better trench filling result may be obtained.

However, although the FCVD process or the HARP CVD process may obtain a better filling effect, the density of the formed interlayer dielectric layer material may be decreased; and the etching rate of the subsequent etching process to the interlayer dielectric layer may be increased. Further, the material of the interlayer dielectric layer and the material of the dummy gate dielectric layer may be same or similar. When the dummy gate dielectric layer is removed by an etching process, the interlayer dielectric layer may also be etched, and the etching rate to the interlayer dielectric layer and the dummy gate dielectric layer may be substantially same. Thus, the electrical properties and the reliability of the semiconductor devices may be severely affected.

In order to lower the etching rate of the etching process to the interlayer dielectric layer, a second annealing process may be performed to increase the density of the interlayer dielectric layer. However, the doping regions may be formed before forming the interlayer dielectric layer; and a first anneal process may be performed to activate the doping ions. Thus, it may need to prevent the diffusion of the doping ions to strictly control the distribution of the ions in the doping regions.

In order to lower the effect of the second annealing process to the distribution of the doping ions; and to prevent the excess diffusion of the doping ions, the annealing temperature of the second thermal annealing process may be lower than the annealing temperature of the first thermal annealing process. For example, the annealing temperature of the first thermal annealing process may be in a range of 1000° C.~1100° C.; and the annealing temperature of the second thermal annealing process may be in range of 600° C.~750° C. Therefore, the density increase of the interlayer dielectric layer material caused by the second thermal annealing process may be limited. Further, although the annealing temperature of the second annealing process may be lower than the annealing temperature of the first thermal annealing process, the distribution of the doping ions in the doping regions may still be affected.

At the same time, in order to improve the properties of the interface layer and the high-K dielectric layer, a third thermal annealing process may be performed onto the interface layer and the high-K dielectric layer after forming the interface layer and the high-K dielectric layer. Similarly, in order to lower to the effect of the third thermal annealing process to the doping regions, the annealing temperature of the third annealing process may be lower than the annealing temperature of the first thermal annealing process. For example, the annealing temperature of the first thermal annealing process may be in a range of approximately 1100° C.~1300° C., and the annealing temperature of the third thermal annealing process may be in a range of approximately 1000° C.~1100° C. The properties of the interface layer and the high-K dielectric layer after the third annealing process using such a lower temperature of may need further improvements. Further, the distribution of the doping ions in the doping regions may still be affected by the third thermal annealing process.

Therefore, the function of the second annealing process and the third annealing process may have limitations; and the properties of the interlayer dielectric layer, the interface layer and the high-K dielectric layer may be need further improvements. Further, the second thermal annealing process may increase the thermal budget of the semiconductor devices, and they may cause the doping ions in the doping regions to redistribute. The redistribution of the doping ions in the doping regions may cause the concentration of the doping ions to be redistributed; and the electrical properties of the semiconductor devices may be affected.

In order to cause the distribution of the doping ions to still match the design requirements; and be able to activate the doping ions, the first thermal annealing process may include two steps: the first step annealing and the second step annealing. The first step annealing may be used to activate the doping ions and cause the doping ions to have a certain extent of diffusion. The second step annealing may be used to further activate the doping ions; and to cause the doping ions to have a further diffusion with a range smaller than the range of the diffusion in the first step annealing. That is, after the two step thermal annealing processes, the distribution of the doping ions may match the design requirement; and the doping ions may be completely activated.

If the first thermal annealing process is not performed after forming the doping regions and before forming the interlayer dielectric layer, and when a thermal annealing is performed after forming the interlayer dielectric layer, the thermal annealing process may be used as the first step annealing of the first thermal annealing process to cause the doping ions in the doping regions to diffuse; and to activate the doping ions for a first time. When another thermal annealing process is performed onto the interface layer and the high-K dielectric layer, such a thermal annealing process may be used as the second step annealing of the first thermal annealing process to activate the doping ions in the doping regions for a second time. Thus, the properties of the interlayer dielectric layer, the interface layer and the high-K dielectric layer may be further improved; and the doping ions in the doping regions may be completely activated. Further, the distribution of the doping ions in the doping regions may match the designed requirements; and a half of the thermal budget of the semiconductor device may be reduced.

Figure 11:
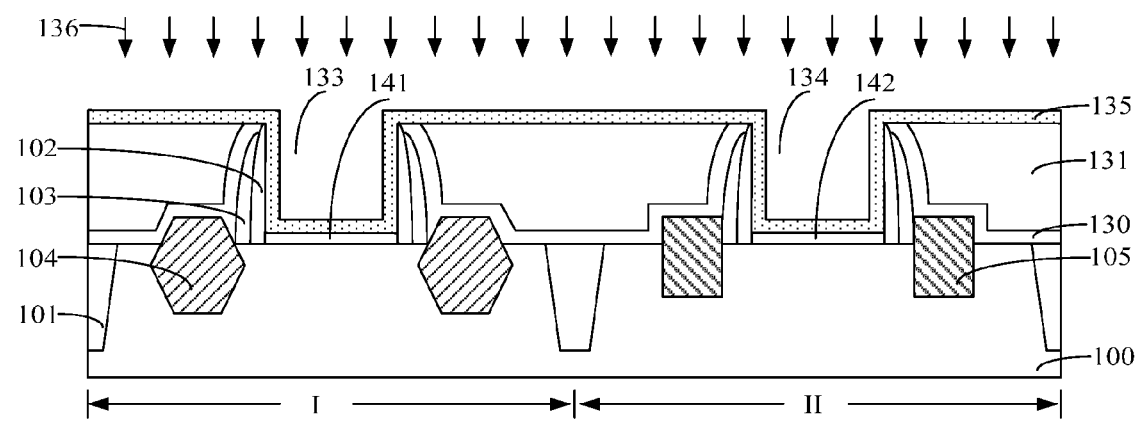
Figure 12:
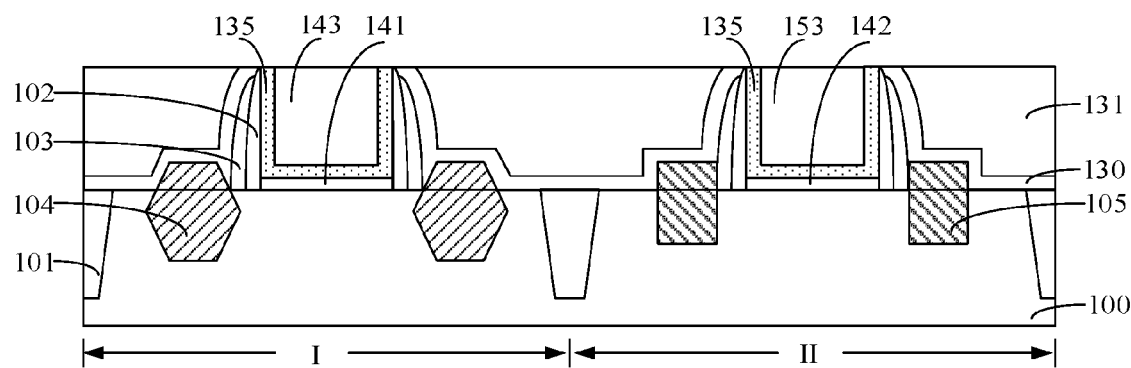
Figure 13:
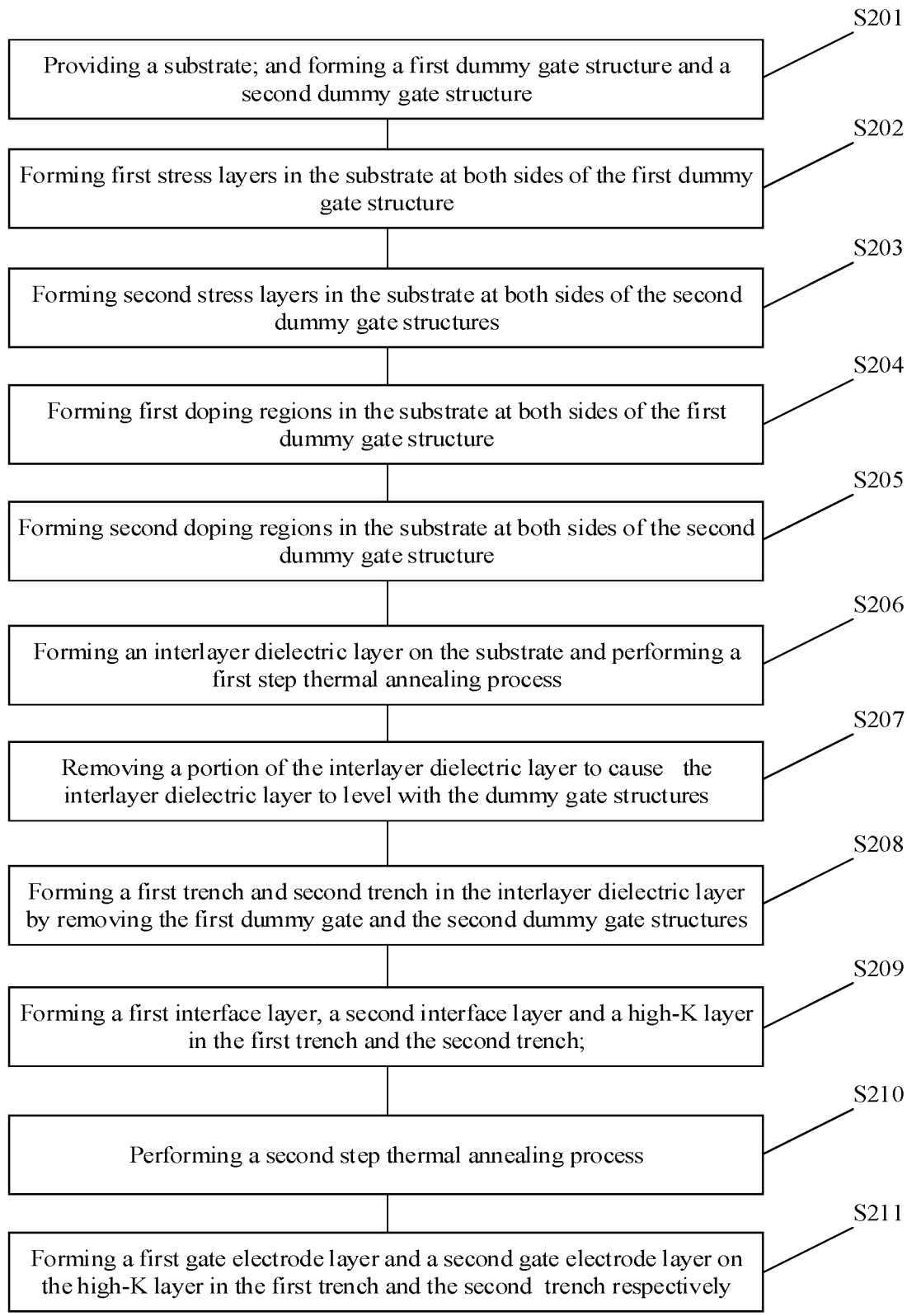
FIG. 13 illustrates an exemplary fabrication process of a semiconductor device consistent with the disclosed embodiments.

FIG. 13 illustrates an exemplary fabrication process of a semiconductor device consistent with the disclosed embodiments; and FIGS. 2~12 illustrate semiconductor structures corresponding to certain stages of the exemplary fabrication process of a semiconductor device.

Figure 2:
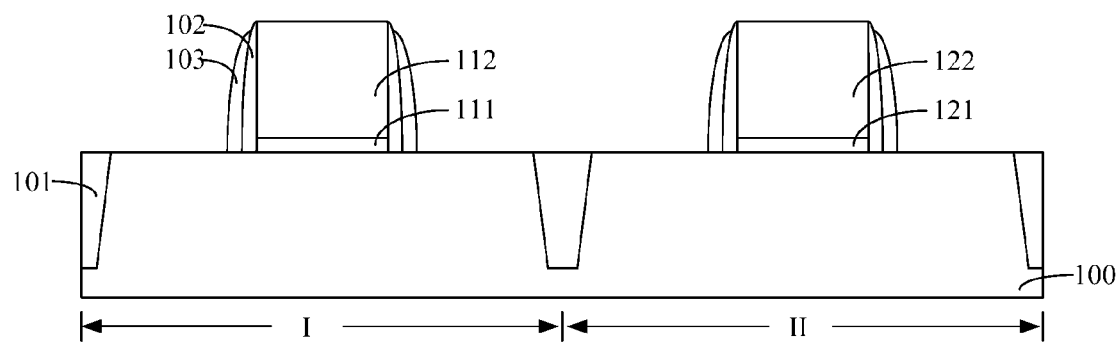
FIGS. 2-12 illustrate semiconductor structures corresponding to certain stages of an exemplary fabrication process of a semiconductor device consistent with the disclosed embodiments.

As shown in FIG. 13, at the beginning of the fabrication process, a substrate with certain structures is provided (S201). FIG. 2 illustrates a corresponding semiconductor structure.

As shown in FIG. 2, a substrate 100 is provided; and a plurality of dummy gate structures (not labeled) may be formed on the surface of the substrate 100. The substrate 100 may include a first region I and a second region II. Further, a plurality of isolation structures 101 may be formed in the surface of the substrate 100.

The substrate 100 may include any appropriate semiconductor materials, such as single crystal silicon, polysilicon, silicon on insulator (SOI), silicon germanium, carborundum, indium antimonide, lead telluride, indium arsenide, indium phosphide, gallium arsenidie, gallium antimonite, alloy semiconductor or a combination thereof. A plurality of the epitaxial layers and/or strain layers may be formed on the surface of the substrate 100 to improve the electrical properties of the semiconductor device. In one embodiment, the substrate 100 is silicon. The substrate 100 provides a base for subsequent processes and structures.

Referring to FIG. 2, the first region I of the substrate 100 may be an NMOS regions or a PMOS region. The second region II of the substrate 100 may be an NMOS region or a PMOS region. The type of the first region I and the type of the second region II may be opposite. The position of the first region I and the position of the second region II may be adjacent or positioned at a regular interval. When the semiconductor devices are NMOS transistors, the first region I and the second region II may be both NMOS regions. When the semiconductor devices are PMOS transistors, the first region I and the second region II may be both PMOS regions. When the semiconductor devices are CMOS transistors, the type of the first region I and the type of the second region II may be opposite.

For illustrative purposes, in one embodiment, the type of the first region I and the type of the second region II are opposite; and two dummy gate structures are used in the description. Referring to FIG. 2, the first region I is a PMOS region and the second region II is an NMOS region.

Further, referring to FIG. 2, the isolation structures 101 may be used to electrically isolate the first region I and the second region II to prevent the electrical interconnection between different semiconductor devices. In one embodiment, the isolation structures 101 are shallow trench isolation (STI) structures. The filling material of the isolation structures 101 may be any appropriate material, such as one or more of silicon oxide, silicon nitride, silicon oxynitride, etc. In one embodiment, the STI structures 101 are made of silicon oxide.

For illustrative purposes, the dummy gate structure formed on the surface of the substrate 100 in the first region I may be referred as a first dummy gate structure; and the dummy gate structure formed on the surface of the substrate 100 in the second region II may be referred as a second dummy gate structure. In certain other embodiments, other number of dummy structures may be formed on the surface of the substrate 100 in the first region I and the second region II.

Further, referring to FIG. 2, the first dummy gate structure may include a first dummy gate dielectric layer 111, and a first dummy gate electrode layer 112 formed on the first dummy gate dielectric layer 111. The second dummy gate structure may include a second dummy gate dielectric layer 121; and a second dummy gate electrode layer 122 formed on the second dummy gate dielectric layer 121. The first dummy gate dielectric layer 111 and the second dummy gate dielectric layer 121 may be used as a contact etching stop layer (CESL) for a subsequent etching process, the unnecessary etching to the substrate 100 caused by subsequently etching the first dummy gate electrode layer 112 and the second dummy gate electrode layer 122 may be prevented.

The first dummy gate dielectric layer 111 and the second dummy gate dielectric layer 121 may be made of any appropriate material, such as silicon oxide, silicon nitride, or silicon oxynitride, etc. In one embodiment, the first dummy gate dielectric layer 111 and the second dummy gate dielectric layer 121 are made of silicon oxide. The thickness of the first dummy gate dielectric layer 111 and the second dummy gate dielectric layer 121 may be in a range of approximately 5 Å~50 Å.

The first dummy gate electrode layer 112 and the second dummy gate electrode layer 122 may be made of any appropriate material. In one embodiment, the first dummy gate electrode layer 112 and the second dummy gate electrode layer 122 are made of polysilicon or doped polysilicon, etc. The thickness of the first dummy gate electrode layer 112 and the second dummy gate electrode layer 122 may be in range of approximately 500 Å~1000 Å.

A process for forming the first dummy gate structure and the second dummy gate structure may include sequentially forming a dummy gate dielectric film (not shown) on the surface of the substrate 100; forming a dummy gate electrode film on the surface of the dummy gate dielectric film; forming a patterned mask layer on the dummy gate electrode film; and etching the dummy gate electrode film and the dummy gate dielectric film using the patterned mask layer as an etching mask. Thus, the first dummy gate structure may be formed on the surface of the substrate 100 in the first region I; and the second dummy gate structure may be formed on the surface of the substrate 100 in the second region II.

Various processes may be used to form the dummy gate dielectric film, such as a thermal oxidation process, a chemical oxidation process, a chemical vapor deposition (CVD) process, a physical vapor deposition (PVD) process, or an atomic layer deposition (ALD) process, etc. The dummy gate electrode film may be formed by any appropriate process, such as a CVD process, a PVD process, an ALD process, or a flowable CVD (FCVD) process, etc. In one embodiment, the dummy gate dielectric film is formed by a CVD process. The subsequent etching process may have a relatively large etching rate to the dummy gate dielectric film formed by the CVD process, the difficulty for etching the dummy gate dielectric film may be reduced; and the etching time may be reduced. That is, the time affecting the subsequently formed interlayer dielectric layer may be reduced; and the affect of the etching process onto the interlayer dielectric layer may be reduced.

Further, returning to FIG. 2, after providing the substrate 100 with the dummy gate structures, sidewall spacers (not labeled) may be formed on the side surfaces of the dummy gate structures. The sidewall spacers may include first sidewall spacers 102 and second sidewall spacers 103 formed on the first sidewall spacers 102. In certain other embodiments, the sidewall spacers may single-layer structures.

An interlayer dielectric layer may be subsequently formed on the surface of the substrate 100, the side surfaces of the interlayer dielectric layer may contact with the outer side surfaces of the sidewall spacers, when the first dummy gate dielectric layer 111 and the second dummy gate dielectric layer 121 are subsequently removed by an etching process, the sidewall spacers may prevent the side surfaces of the interlayer dielectric layer from being etched. Thus, the regions for subsequently forming the first dielectric layer and the second dielectric layer may be not be enlarged, the size of the subsequently formed first dielectric layer and second dielectric layer may not be enlarged neither; and the performance of the semiconductor device may be improved.

The sidewall spacers may be made of any appropriate material, such as silicon oxide, silicon nitride, or silicon oxynitride, etc. In one embodiment, the first sidewall spacers 102 are made of nitride material, such as SiN, SiON, SiOBN, or SiOCN, etc, thus the first sidewall spacers 102 may be referred as nitride spacers 102. Further, the second sidewall spacers 103 are silicon oxide, thus the second sidewall spacer may be referred as oxide spacers 102. Because a wet etching process may have a significantly high etching selectivity to silicon oxide and silicon nitride; and the first sidewall spacers 102 are formed on the side surfaces of the first dummy gate structure and the second dummy gate structure, the subsequent etching process for removing the first dummy gate dielectric layer 111 and the second dummy gate dielectric layer 121 may barely etch the first sidewall spacers 102 made of silicon nitride. Thus, the enlargement of the regions for subsequently forming the first gate dielectric layer and the second gate dielectric layer may be further avoided; and it may further prevent the enlargement of the size of the subsequently formed first gate dielectric layer and second gate dielectric layer; and the size bias between the subsequently formed first gate dielectric layer and the second gate dielectric layer and the designed size.

A process for forming the sidewall spacers may include forming a sidewall spacer film on the surface of the substrate 100 in the first region I and the second region II, the side and top surfaces of the first dummy gate and the side and top surfaces of the second dummy gate structure; and followed by an etch back process to remove the portion of the sidewall spacer film on the top surface of the first dummy gate structure, the top surface of the second dummy gate structure and the surface of the substrate 100. Thus, the sidewall spacers may be formed on the side surfaces of the first dummy gate structure and the second dummy gate structure.

The sidewall spacer film may be formed by any appropriate process, such as a CVD process, a PVD process, an ALD process, or an FCVD process, etc. In one embodiment, the thickness of the first sidewall spacer 102 may be in a range of approximately 5 Å~50 Å. The thickness of the second sidewall spacer 103 may be in a range of approximately 5 Å~50 Å.

Before forming the sidewall spacers, first lightly-doped drain (LDD) regions may be formed in the substrate 100 in the first region I at both sides of the first dummy gate structure; and second lightly-doped drain (LDD) regions may be formed in the substrate 100 in the second region II at both sides of the second dummy gate structure. The first lightly-doped drain regions and the second lightly-doped drain regions may aid to relieve the hot-carrier effect of the semiconductor device.

Figure 3:
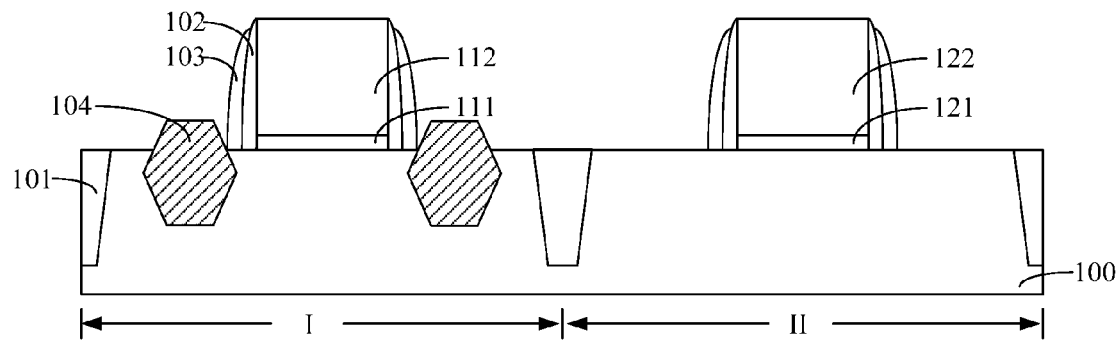

Returning to FIG. 13, after forming the sidewall spacers, first openings may be formed; and first stress layers may be formed in the first openings (S202). FIG. 3 illustrates a corresponding semiconductor structure.

As shown in FIG. 3, first openings (not labeled) are formed in the substrate 100 at both sides of the first dummy gate structure; and first stress layers 104 are formed in the first openings. The first stress layers 104 may be used to apply a stress onto the channel region in the first region I, thus the carrier mobility of the semiconductor device may be increased; and the performance of the semiconductor device may optimized.

The first openings may be any appropriate shape, such as a sigma "E" shape, a rectangular shape, or a "U" shape, etc. In one embodiment, the first openings are a sigma shape. The position and the size of the first openings may be determined according to the practical requirements of the fabrication process. The stress on the channel region applied by the first layers 104 may be reversely proportional to the distance between the first stress layers 144 and the first dummy gate structure. Thus, in order to cause the first stress layers 104 to apply a large enough stress onto the channel region in the first region I, the side surface of the first openings may need to be as close as possible to the side surface of the first dummy gate structure. That is, the side surface of the first openings may need to be as close as possible to the channel region in the first region I.

In one embodiment, a process for forming the first openings may include sequentially forming a mask layer (not shown) to cover the sidewall spacers, the first dummy gate structure, the second dummy gate structure and the surface of the substrate 100; forming a photoresist layer on the mask layer (not shown); etching the mask layer in the first region I; etching the a portion of the substrate 100 at both sides of the first dummy gate structure to form pre-openings using the photoresist layer as an etching mask; removing the photoresist layer; and etching the pre-openings to form the first openings in the substrate 100 at both sides of the first dummy gate structure.

The pre-openings may be etched by any appropriate process, such as a dry etching process, a wet etching process, or an ion beam etching process, etc. In one embodiment, a wet etching process is used to etch the pre-openings to form the first openings. The etching solution may be a tetramethylammonium Hydroxide (TAMOH) solution or an ammonia solution, etc. When a TAMOH solution or an ammonia solution is used for the wet etching process, the wet etching process may have a greater etching rate to the (100) crystal orientation than the etching rate to the (111) crystal orientation. Thus, after the wet etching process, the first openings with a sigma shape may be formed.

The first stress layers 104 may be made of any appropriate material, such as SiGe, SiC, SiGeB, or SiCP, etc. Referring to FIG. 3, the top surfaces of the first stress layers 104 may level with the surface of the substrate 100. In certain other embodiments, the top surfaces of the first stress layers 104 may be higher than the surface of the substrate 100.

In one embodiment, the first region I is a PMOS region. In order to increase the carrier mobility of the channel region in the first region I, the first stress layers 104 may be formed to apply a stress to the channel region in the substrate 100. When the material of the first stress layers 104 is SiGe, or SiGeB, the percentile of Ge atoms may be in a range of approximately 10%~50%. When the material of the stress layers 104 is SiGeB, the concentration of B atoms may be in a range of approximately $1E18$ atom/cm$^3$~$3E20$ atom/cm$^3$.

Various processes may be used to form the first stress layers 104, such as a CVD process, a PVD process, an FCVD process, or an epitaxial growth process, etc. In one embodiment, the first stress layers 104 are formed by a selective epitaxial growth process.

In one embodiment, the first stress layers 104 are made of SiGe. The reaction gas of the selective epitaxial growth process for forming the stress layers 104 may include a silicon source gas, a germanium source gas, HCl and H$_2$, etc. The silicon source gas may include SiH$_4$, SiH$_2$Cl$_2$, or Si$_2$H$_6$, etc. The germanium source gas may be GeH$_4$, etc. The flow of the silicon source gas may be in a range of approximately 5 sccm~500 sccm. The flow of the germanium source gas may be in a range of approximately 5 sccm~500 sccm. The flow of HCl may be in a range of approximately 1 sccm~300 sccm. The flow of H$_2$ may be in a range of approximately 1000 sccm~50000 sccm. The pressure of the reaction chamber of the selective epitaxial growth process may be in a range of approximately 0.05 Torr~50 Torr. The temperature of the reaction chamber may be in a range of approximately 400° C.~900° C.

Figure 4:
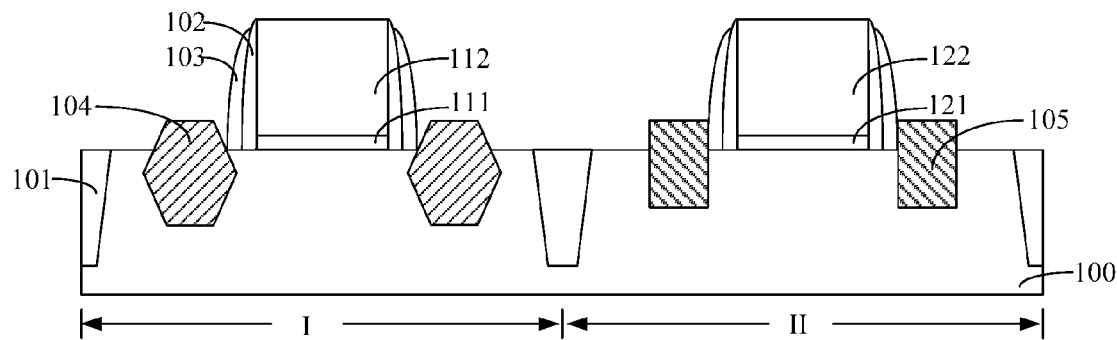

Returning to FIG. 13, after forming the first stress layers 104, second openings may be formed; and second stress layers may be formed in the second openings (S203). FIG. 4 illustrates a corresponding semiconductor structure.

As shown in FIG. 4, second openings (not labeled) are formed in the substrate 100 at both sides of the second dummy gate structure; and second stress layers 105 are formed in the second openings. The second stress layers 105 may be used to apply a stress onto the channel region in the second region II, thus the carrier mobility of the semiconductor device may be increased; and the performance of the semiconductor device may optimized.

The second openings may be any appropriate shape, such as a sigma "Σ" shape, a rectangular shape, or a "U" shape, etc. In one embodiment, the first openings are a rectangular shape. The position and the size of the first openings may be determined according to the practical requirements of the fabrication process.

In one embodiment, a process for forming the first openings may include sequentially forming a mask layer (not shown) to cover the sidewall spacers, the first dummy gate structure, the first stress layers 104 and the surface of the substrate 100; forming a photoresist layer on the mask layer (not shown); etching the mask layer in the second region II and etching the a portion of the substrate 100 at both sides of the second dummy gate structure to form the second openings using the photoresist layer as an etching mask. The substrate 100 may be etched by any appropriate process, such as a dry etching process, a wet etching process, or an ion beam etching process, etc.

The second stress layers 105 may be made of any appropriate material, such as SiC, or SiCP, etc. Referring to FIG. 4, the top surfaces of the second stress layers 105 may level with the surface of the substrate 100. In certain other embodiments, the top surfaces of the second stress layers 105 may be higher than the surface of the substrate 100.

In one embodiment, the second region II is an NMOS region. In order to increase the carrier mobility of the channel region in the second region II, the second stress layers 105 may be formed to apply a stress to the channel region in the substrate 100. When the material of the second stress layers 105 is SiC, or SiCP, the percentile of C atoms may be in a range of approximately 1%~10%. When the material of the stress layers 104 is SiCP, the concentration of P atoms may be in a range of approximately 1E15 atom/cm$^3$~5E18 atom/cm$^3$.

Various processes may be used to form the second stress layers 105, such as a CVD process, a PVD process, an FCVD process, or an epitaxial growth process, etc. In one embodiment, the second stress layers 105 are formed by a selective epitaxial growth process.

In one embodiment, the second stress layers 105 are made of SiC. The reaction gas of the selective epitaxial growth process for forming the second stress layers 105 may include a silicon source gas, and a carbon source gas, etc. The silicon source gas may include SiH$_4$, or SiH$_2$Cl$_2$, etc. The carbon source gas may include C$_2$H$_2$, C$_3$H$_8$, or C$_2$H$_6$, etc. The reaction gas may also include HCl and H$_2$, etc. The flow of the silicon source gas may be in a range of approximately 5 sccm~500 sccm. The flow of the carbon source gas may be in a range of approximately 5 sccm~500 sccm. The flow of HCl may be in a range of approximately 5 sccm~500 sccm. The flow of H$_2$ may be in a range of approximately 1000 sccm~50000 sccm. The pressure of the reaction chamber of the selective epitaxial growth process may be in a range of approximately 1 Torr~500 Torr. The temperature of the reaction chamber may be in a range of approximately 400° C.~600° C.

Figure 5:
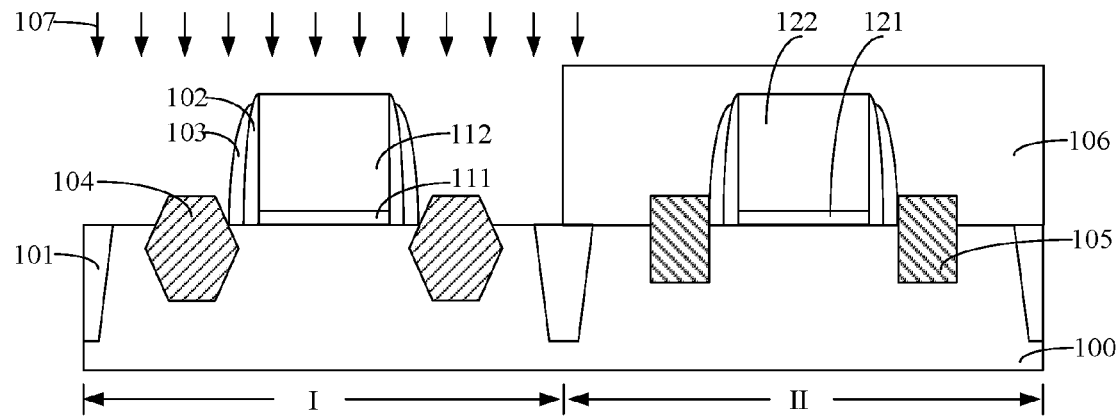

Returning to FIG. 13, after forming the second stress layers 105, a first doping process may be performed to form first doping regions (S204). FIG. 5 illustrates a corresponding semiconductor structure.

As shown in FIG. 5, a first doping process is performed onto the first region I to form first doping regions (not shown). The doping ions of the first region I may be P-type ions or N-type ions. The first doping regions and the first stress layers 104 may be configured as the source/drain regions of the PMOS transistor.

The first doping process for forming the first doping regions may include sequentially forming a first photoresist layer 106 to cover the surface of the substrate 200, the surface of the second dummy gate structure, and the surfaces of the second stress layers 105 in the second region II; and performing a first ion implantation process 107 onto the substrate 100 at both sides of the first dummy gate structure using the first photoresist layer 106 as a mask. Thus, the first doping regions may be formed in the substrate 100 at both sides of the first dummy gate structure. After forming the first doping regions, the first photoresist layer 106 may be removed.

In one embodiment, the first stress layers 104 may be formed in the substrate 100 at both sides of the first dummy gate structure, the first ion implantation process 107 may also be performed onto the first stress layers 104. The doping ions of the first ion implantation process 107 may be P-type ions. The P-type ions may include boron ions, gallium ions, or indium ions, etc. In one embodiment, the doping ions are boron ions. The energy of the first ion implantation process 107 may be in a range of approximately 1 KeV~50 KeV. The dose of the first ion implantation process 107 may be in a range of approximately 1E15 atom/cm$^2$~5E18 atom/cm$^2$.

In one embodiment, the first doping regions are formed after forming the second stress layers 105. In certain other embodiments, the first doping regions may be formed in substrate 100 at both sides of the first dummy gate structure after forming the first stress layers 104 and before forming the second stress layers 105.

Figure 6:
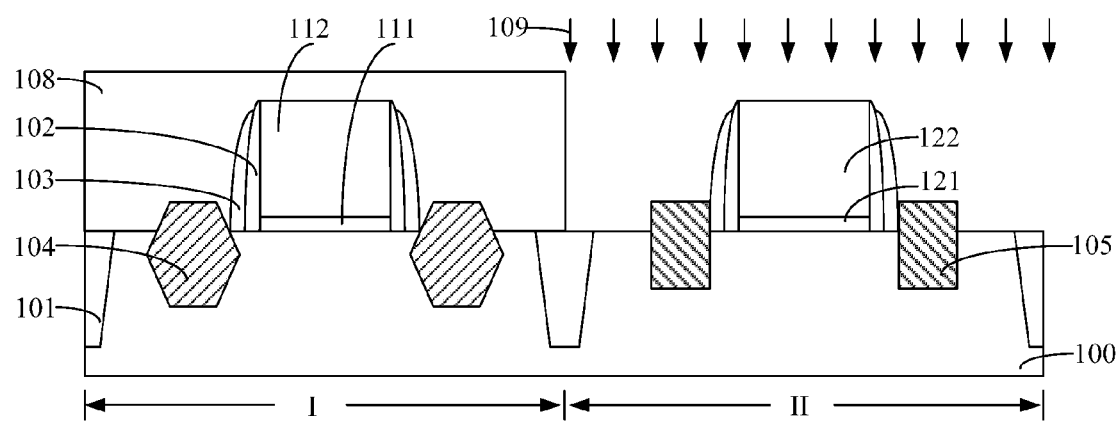

Returning to FIG. 13, after performing the first doping process, a second doping process may be performed to form second doping regions (S205). FIG. 6 illustrates a corresponding semiconductor structure.

As shown in FIG. 6, a second doping process is performed onto the second region II to form second doping regions (not shown). The doping ions of the second doping regions may be P-type ions or N-type ions. The second doping regions and the second stress layers 105 may be configured as the source/drain regions of the NMOS transistor.

The second doping process for forming the second doping regions may include sequentially forming a second photoresist layer 108 to cover the surface of the substrate 200, the surface of the first dummy gate structure, and the surfaces of the first stress layers 105 in the first region I; and performing a second ion implantation process 109 onto the substrate 100 at both sides of the second dummy gate structure using the second photoresist layer 108 as a mask. Thus, the second doping regions may be formed in the substrate 100 at both sides of the second dummy gate structure. After forming the second doping regions, the second photoresist layer 108 may be removed.

In one embodiment, the second stress layers 105 may be formed in the substrate 100 at both sides of the second dummy gate structure, the second ion implantation process 109 may also be performed onto the second stress layers 105. The doping ions of the second ion implantation process 109 may be N-type ions. The N-type ions may include phosphorous ions, arsenic ions, or antimony ions, etc. In one embodiment, the doping ions are phosphorous ions. The energy of the second ion implantation process 109 may be in a range of approximately 5 KeV~100 KeV. The dose of the second ion implantation process 109 may be in a range of approximately 5E16 atom/cm$^2$~5E20 atom/cm$^2$.

Figure 7:
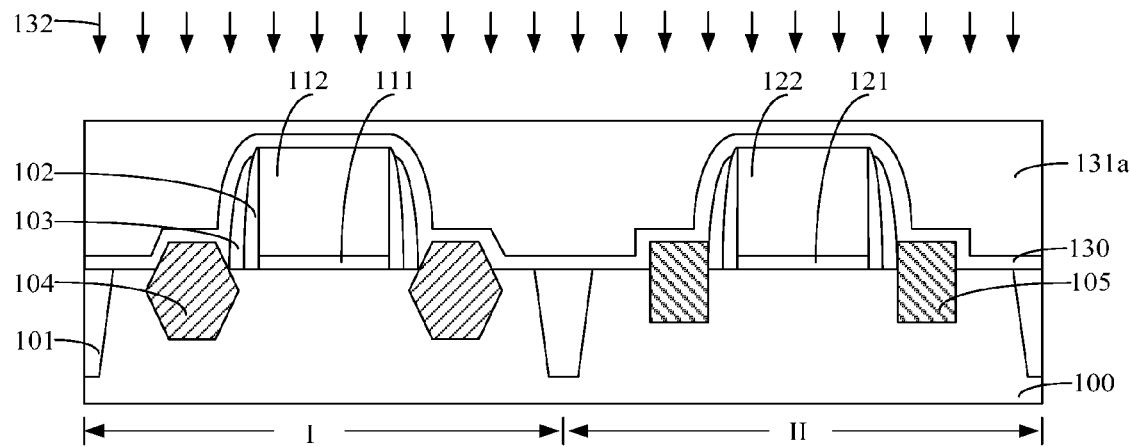

Returning to FIG. 13, after forming the second doping regions, a contact etching stop layer and an interlayer dielectric layer may be formed (S206). FIG. 7 illustrates a corresponding semiconductor structure.

As shown in FIG. 7, a contact etching stop layer (CESL) 130 is formed on the surface of the substrate 100. The CESL 130 also covers the top surface of the first dummy gate structure, the top surface of the second dummy gate structure, the surface of the first stress layers 104, the surface of the second stress layers 105 and the side surfaces of the sidewall spacers. Further, an interlayer dielectric film 131a is formed on the surface of the CESL 130.

The CESL 130 may be used as a stop layer for subsequently etching the interlayer dielectric film 131a to expose the first dummy gate structure and the second dummy gate structure. Thus, the unnecessary etching onto the interlayer dielectric layer 131 may be prevented.

The CESL 130 may be made of any appropriate material, such as silicon oxide, silicon nitride, or silicon oxynitride, etc. Various processes may be used to form the CESL 130, such as a CVD process, a PVD process, an ALD process, or an FCVD process, etc.

The interlayer dielectric film 131a may be made of any appropriate material, such as silicon oxide, silicon nitride, or silicon oxynitride, etc. In one embodiment, the interlayer dielectric film 131a is made of silicon oxide.

With the continuous shrinking of the size of the semiconductor device, the size of the substrate 100 between the first dummy gate structure and the second dummy gate structure has become smaller and smaller; and the height-to-width ratio of the gap between the first dummy gate structure and the second dummy gate structure has become larger and larger, thus, it may be more and more difficult to fill the interlayer dielectric film 131a into the gap between the first dummy gate structure and the second dummy gate structure. In order to improve the filling effect of the interlayer dielectric film 131a; and prevent the voids from being formed at the corner between the first dummy gate structure and the substrate 100 and the corner between the second dummy gate structure and the substrate 100, an FCVD process or a HARP CVD process may be used to form the interlayer dielectric film 131a.

In one embodiment, the interlayer dielectric film 131a is made of silicon oxide; and a HARP CVD process is used to form the interlayer dielectric film 131a. The reaction gas of the HARP CVD process may include a silicon source gas and an oxygen source gas. The silicon source gas may include SiH$_4$, or SiH$_2$Cl$_2$, etc. The oxygen source gas may be O$_2$. The flow of the silicon source gas may be in a range of approximately 20 sccm~2000 sccm. The flow of the oxygen source gas may be in a range of approximately 10 sccm~1000 sccm. The pressure of the reaction chamber of the HARP CVD process may be in a range of approximately 1 mTorr~50 Torr. The temperature of the reaction chamber may be in a range of approximately 450° C.~800° C.

Further, referring to FIG. 7, after forming the interlayer dielectric film 131a, a first step thermal annealing process 132 may be performed onto the interlayer dielectric film 131a, the first doping regions and the second doping regions. The first step thermal annealing process 132 may be used to increase the density of the interlayer dielectric film 131a. The first step thermal annealing process 132 may also be used to activate the doping ions in the first doping regions and the second regions for the first time.

Because the density of the interlayer dielectric film 131a formed by the FCVD process or the HARP CVD process may be relatively low, when the first dummy gate structure and the second dummy gate structure are subsequently removed by an etching process, the etching process may etch the interlayer dielectric film 131a. Especially when the interlayer dielectric film 131a, the first dummy gate structure 111 and the second dummy gate structure 121 are made of silicon oxide, if the density of the interlayer dielectric film 131a is relatively low, the etching rate of the etching process that is used to subsequently remove the first dummy gate dielectric layer 111 and the second dummy gate dielectric layer 121 to the interlayer dielectric film 131a may be significantly high, thus the electrical properties of the semiconductor device with the etched interlayer dielectric film 131a may be affected.

Therefore, before removing the first dummy gate structure and the second dummy gate structure, the first step thermal annealing process 132 may be performed onto the interlayer dielectric film 131a to increase the density of the interlayer dielectric film 131a. Thus, the etching rate of the subsequent etching process to the interlayer layer dielectric film 131a may be reduced; and the effect to the interlayer dielectric film 131a caused by the subsequent etching process for removing the first dummy gate structure and the second dummy gate structure may be minimized.

Further, when the first step thermal annealing process 132 is performed onto the interlayer dielectric film 131a, the first doping regions and the second doping regions may be annealed simultaneously. Thus, the first step thermal annealing process 132 may activate the doping ions of the first doping regions and the second doping regions. Further, the doping ions in the first regions and the second regions may diffuse to a certain extent to cause the first doping regions and the second regions to approach the channel region in the substrate 100.

The interlayer dielectric film 131a may be relatively thick, in order to increase the density of the interlayer dielectric film 131a as much as possible, the annealing time of the first step thermal annealing process 132 may be relatively long. However, if the annealing time of the first step thermal annealing process 132 is significantly long, it may cause the doping ions in the first doping regions and the second doping regions to significantly diffuse. Further, since the annealing time of the first thermal annealing process may be relatively long, in order to prevent the doping ions in the first doping regions and the second doping regions from having significantly large diffusion, the annealing temperature of the first step thermal annealing process 132 may not be significantly high.

Therefore, in one embodiment, the annealing temperature of the first step thermal annealing process 132 may be in a range of approximately 1000° C.~1100° C. The temperature increasing rate may be in a range of approximately 200° C./s~300° C./s. The temperature decreasing rate may be in a range of approximately 200° C./s~350° C./s. The total thermal annealing time may be equal to the temperature increasing time and the temperature decreasing time.

After the first step thermal annealing process 132, because the thermal annealing time may be relatively long, the doping ions in the first doping regions and the second doping regions may be able to diffuse to a certain extent; and the density of the interlayer dielectric film 131a may be effectively increased. Further, the annealing temperature of the first step thermal annealing process 132 may be in a range of approximately 1000° C.~1100° C., the excess diffusion of the doping ions in first doping regions and the second doping regions caused by the first step thermal annealing process 132 may be avoided.

The first step thermal annealing process 132 may be a rapid thermal annealing process, a laser annealing process, or a spike annealing process, etc. In one embodiment, the first annealing process 132 is a spike thermal annealing process.

In one embodiment, the interlayer dielectric film 131a, the first doping regions and the second doping regions may be annealed by the first step thermal annealing process 132 simultaneously, thus a thermal annealing process for only annealing the doping regions, i.e., a source/drain thermal annealing process may be omitted; and the thermal budget of the semiconductor device may be reduced. Further, the first step thermal annealing process 132 may be performed onto the interlayer dielectric film 131a, the first doping regions and the second doping regions simultaneously, thus the temperature on the interlayer dielectric film 131a and the temperature on the first doping regions and the second doping regions may be identical. Comparing with the method illustrated in FIG. 1, the temperature for annealing the interlayer dielectric film 131a of the disclosed method may be greater than the temperature for annealing the interlayer dielectric layer of the method illustrated in FIG. 1, thus the density of the interlayer dielectric film 131a formed by the disclosed method may be greater than the density of the interlayer dielectric layer formed by the method illustrate in FIG. 1; and the etching rate of the subsequent etching process to the interlayer dielectric film 131a may be significantly low; and the electrical properties of the semiconductor device may be improved.

Referring to FIG. 1, if the interlayer dielectric layer is annealed after annealing the first doping regions and the second doping regions, in order to prevent the annealing process of the interlayer dielectric layer to affect the first doping regions and the second doping regions, the annealing temperature of the interlayer dielectric layer (approximately 600° C.~750° C.) may be lower than the annealing temperature of the first doping regions and the second doping regions (approximately 1000° C.~1100° C.), thus the density increase of the interlayer dielectric layer is limited; the subsequent etching process may still have a relatively large etching rate to the interlayer layer dielectric layer; and the electrical properties of the semiconductor device may be affected.

Figure 8:
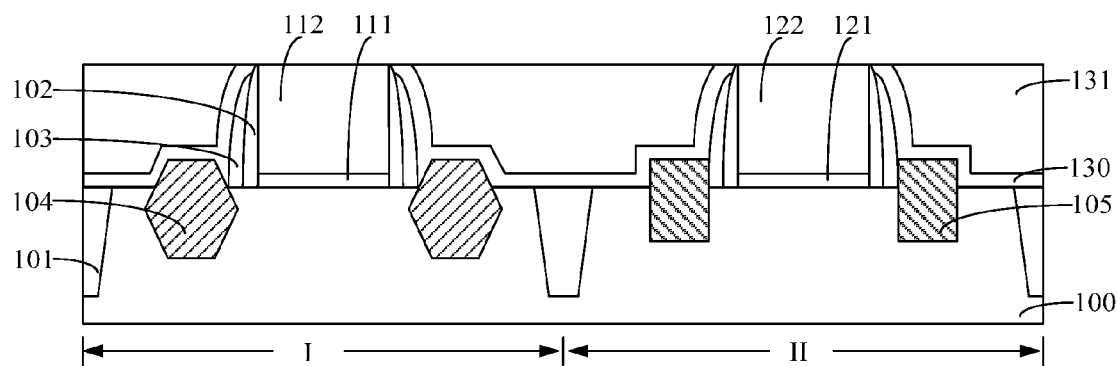

Returning to FIG. 13, after forming the interlayer dielectric film 131a and performing the first step thermal annealing process 132, the top portion of the interlayer dielectric film 131a may be removed (S207). FIG. 8 illustrates a corresponding semiconductor structure.

As shown in FIG. 8, the portion of the interlayer dielectric film 131a higher than the top surface of the first dummy gate structure and the top surface of the second dummy gate structure is removed; and the portion of the CESL 130 higher than the top surface of the first dummy gate structure and the top surface of the second dummy gate structure is also removed. Thus, the top surface of the interlayer dielectric layer 131, formed by removing portions of the interlayer dielectric film 131a in FIG. 7, may level with the top surface of the first dummy gate structure and the top surface of the second dummy gate structure.

The portion of the interlayer dielectric film 131a and the portion of the CESL 130 may be removed by any appropriate process, such as a chemical mechanical polishing process, a physical mechanical polishing process, or an etching process, etc. In one embodiment, the portion of the interlayer dielectric film 131a and the portion of CESL 130 are removed by a chemical mechanical polishing process.

Because the first step thermal annealing process 132 may be performed onto the interlayer dielectric film 131a before removing the portion of the interlayer dielectric film by the chemical mechanical polishing process, the density of the interlayer dielectric layer 131 may be increased, thus the dishing effect caused by a relatively low density of the interlayer dielectric layer 131 may be prevented; and the surface properties of the interlayer dielectric layer 131 may be improved.

If the first step thermal annealing process is performed onto the interlayer layer dielectric film 131a after the chemical mechanical polishing process, the density of the interlayer dielectric layer 131 may be relatively low; and the hardness difference between the interlayer dielectric layer 131 and the first dummy gate structure and the second dummy gate structure may be significantly large. When the chemical mechanical polishing process is used to polish the interlayer dielectric film 131a, the top surface of the first dummy gate structure and the second dummy gate structure may be used as the polishing stop layer, if the hardness difference between the interlayer dielectric film 131a and the first dummy gate structure and the second dummy gate structure is significantly large, the dishing defects may be formed on the surface of the interlayer dielectric layer 131; and the subsequent processes may be affected.

In one embodiment, in order to avoid the dishing effects, the first step thermal annealing process 132 may be performed onto the interlayer dielectric film 131a to increase the density of the interlayer dielectric film 131a before polishing the interlayer dielectric film 131a by the chemical mechanical polishing process. In certain other embodiments, a first thermal annealing process may be performed onto the interlayer dielectric film 131a, the first doping regions and the second doping regions after polishing to form the interlayer dielectric layer 131 to cause the top surface of the interlayer dielectric layer 131 to level with the top surface of the first dummy gate structure and the second dummy gate structure.

Figure 9:
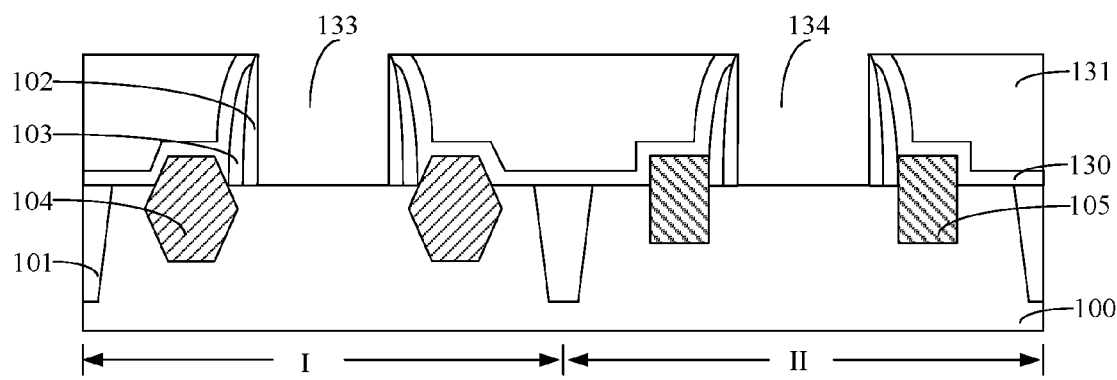

Returning to FIG. 13, after removing a portion of the interlayer dielectric film 131a to cause the top surface of the interlayer dielectric layer 131 to level with the top surfaces of the first dummy gate structure and the second dummy gate structure, a first trench and a second trench may be formed (S208). FIG. 9 illustrates a corresponding semiconductor structure.

As shown in FIG. 9, the first dummy gate structure and the second dummy gate structure are removed to expose the surface of the substrate 100. A first trench 133 is formed in the interlayer dielectric layer 131 in the first region I; and a second trench 134 is formed in the interlayer dielectric layer 131 in the second region II. The size and the position of the first trench 133 and the second trench 134 may identical to the size and the position of the first dummy gate structure and the second dummy gate structure.

A process for removing the first dummy gate structure and the second dummy gate structure may include sequentially removing the first dummy gate electrode layer 112 and the second dummy gate electrode layer 122 by a first etching process; and followed by removing the first dummy gate dielectric layer 111 and the second dummy gate dielectric layer 121. Thus, the surface of the substrate 100 is exposed; and the first trench 133 and the second trench 134 may be formed.

The first etching process may be a dry etching process, a wet etching process, or a combination of a dry etching process and a wet etching process, etc. The first gate dielectric layer 111 and the second gate dielectric layer 121 may be used as the etching stop layer of the first etching process.

In one embodiment, the first etching process is a dry etching process. The etching gases may be $CF_4$, or $CHF_3$, etc.

The second etching process may be a dry etching process, a wet etching process, or a combination of a dry etching process and a wet etching process, etc. The surface of the substrate 100 under the first gate dielectric layer 111 and the second dielectric layer 121 may be used as an etching stop of the second etching process.

In one embodiment, the second etching process is a wet etching process. The etching solution of the wet etching process may be a diluted hydrogen fluoride (DHF) solution. The volume ratio of de-ionized water and HF may be in a range of approximately 300:1~700:1.

Because the density of the interlayer dielectric layer 131 may be relatively high, the second etching process may have a significantly low etching rate to the interlayer dielectric layer 131. Thus, it may prevent the second etching process from etching the interlayer dielectric layer 131; and the yield of the semiconductor device may be improved.

Figure 10:
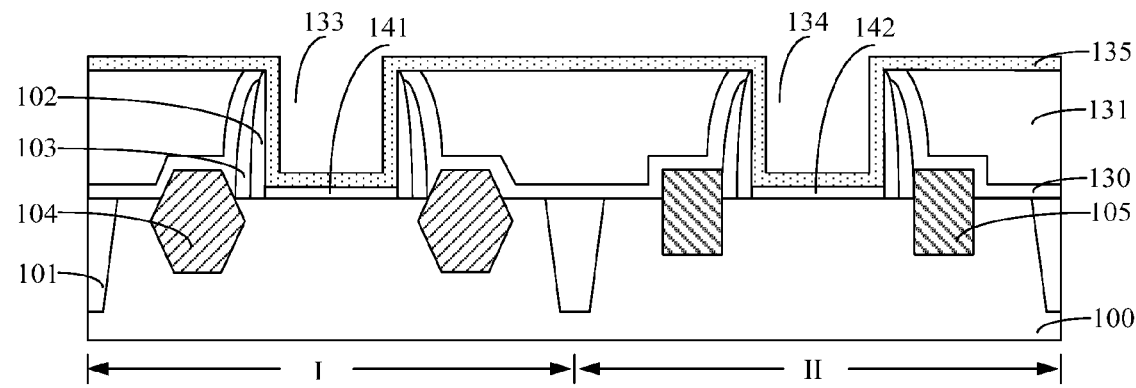

Returning to FIG. 13, after forming the first trench 133 and the second trench 134 in the interlayer dielectric layer 131 in the first region I and the second region II respectively, a first gate dielectric layer and a second gate dielectric layer may be formed (S209). FIG. 10 illustrates a corresponding semiconductor structure.

As shown in FIG. 10, a first gate dielectric layer (not labeled) is formed on the surface of the substrate 100 on the bottom of the first trench 133; and a second gate dielectric layer (not labeled) is formed on the surface of the substrate 100 on the bottom of the second trench 134. The first gate dielectric layer may include a first interface layer 141 formed on the surface of the substrate 100 on the bottom of the first trench 133 and a high-K dielectric layer 135 formed on the top surface of the first interface layer 141 and the side surface of the first trench 133. The second gate dielectric layer may include a second interface layer 142 formed on the surface of the substrate 100 on the bottom of the second trench 134 and the high-K dielectric layer 135 formed on the surface of the second interface layer 142 and the side surface of the second trench 134.

Further, referring to FIG. 10, the high-K dielectric layer 135 may also be formed on the top surface of the interlayer dielectric layer 131. The portion of the high-K dielectric layer 135 formed on the top surface of the interlayer dielectric layer 131 may be subsequently removed.

The first interface layer 141 and the second interface layer 142 may provide a desired interface layer for forming the high-K dielectric layer 135; and improve the interface properties between the high-K dielectric layer 135 and the substrate 100. The first interface layer 141 and the second interface layer 142 may be made of any appropriate material, such as thermal oxide (oxide formed by a thermal oxidation process), oxynitride, or other appropriate oxide materials. Various processes may be used to form the first interface layer 141 and the second interface layer 142, such as a CVD process, a PVD process, an ALD process, or a thermal oxidation process, etc.

In one embodiment, the first interface layer 141 and the second interface layer 142 are made of silicon oxide. The thickness of the first interface layer 141 and the second interface layer 142 may be in a range of approximately 5 Å~10 Å.

The high-K dielectric layer 135 may be made of a material having a dielectric constant higher that the dielectric constant of silicon oxide, such as LaO, AlO, BaZrO, HfSiO, HfZrO, HfZrON, HfLaO, HfSiON, LaSiO, AlSiO, HfTaO, HfTiO, $Al_2O_3$, $Si_3N_4$, or $BaSrTiO_3$, etc. Various processes may be used to form the high-K dielectric layer 135, such as a CVD process, a PVD process, an ALD process, or an FCVD process, etc.

In one embodiment, the high-K dielectric layer 135 is made of HfSiO. The thickness of the high-K dielectric layer 135 is in a range of approximately 10 Å~30 Å.

Returning to FIG. 13, after forming the high-K dielectric layer 135, a second step thermal annealing process may be performed (S210). FIG. 11 illustrates a corresponding semiconductor structure.

As shown in FIG. 11, a second step thermal annealing process 136 is performed onto the first gate dielectric layer, the second gate dielectric layer, the first doping regions and the second doping regions. The second step thermal annealing process 136 may be used to activate the doping ions in the first doping regions and the second doping regions for a second time; and increase the density of the first gate dielectric layer and the second gated dielectric layer.

After performing the second step thermal annealing process 136, the properties of the first interface layer 141, the second interface layer 142 and the high-K dielectric layer 135 may be improved. Further, because the temperature of the first step thermal annealing process 132 may be relatively low, the activating scale of the first step thermal annealing process 132 to the doping ions of the first doping regions and the second doping regions may be limited. When the second step thermal annealing process 136 is performed onto the first gate dielectric layer and the second gate dielectric layer, the first doping regions and the second doping regions may also be annealed simultaneously; and the doping ions in the first doping regions and the second doping regions may be activated for a second time.

The annealing time of the first step thermal annealing process 132 may be relatively long and, after the first step thermal annealing process 132, the doping ions in the first doping regions and the second doping regions may have a relatively large scale diffusion. Thus, the annealing time of the second step thermal annealing process 136 may be relatively short so as to prevent the doping ions in the first doping regions and the second doping regions from having an excess diffusion.

Further, comparing with the interlayer dielectric layer 131, the thickness of the first gate dielectric layer and the second gate dielectric layer may be much smaller, thus, although the annealing time of the second step thermal annealing 136 is relatively short, it may be still able to effectively improve the properties of the first gate dielectric layer and the second gate dielectric layer. Further, because the activating scale of the first annealing process 132 to the first doping regions and the second doping regions may be limited, the annealing temperature of the second step thermal annealing process 136 may be relatively high such that the doping ions in the first doping regions and the second doping regions may be completely activated.

That is, the annealing time of the second step thermal annealing process 136 may be smaller than the annealing time of the first step thermal annealing process 132; and the annealing temperature of the second step thermal annealing process 136 may be greater than the annealing temperature of the first step thermal annealing process 132.

Therefore, according to requirements of the second step thermal annealing process 136, in one embodiment, the annealing temperature of the second step thermal annealing process 136 may be in a range of approximately 1100° C.~1300° C. The annealing time of the second step thermal annealing process 136 may be in a range of approximately 0.05 ms~10 ms.

The second step thermal annealing process 136 may be relatively short, thus the over diffusion of the doping ions in the first doping regions and the second doping regions may be prevented. Further, the first interface layer 141, the second interface 142 and the interlayer dielectric layer 135 may be relatively thin, thus the relatively short annealing time of the second thermal annealing time 136 may be still able to match the requirements for improving the properties of the first interface layer 141, the second interface layer 142 and the high-K dielectric layer 135.

Further, the annealing temperature of the second thermal annealing process 136 may be relatively high, the doping ions in the first doping regions and the second doping regions may be further activated; and the complete activation of the doping ions in the first doping regions and the second doping regions may be ensured. Further, the relatively high annealing temperature of the second step thermal annealing process 136 may be able to improve the properties of the first interface layer 141, the second interface layer 142 and the high-K dielectric layer 135.

The second step thermal annealing process 136 may be any appropriate annealing process, such as a rapid thermal annealing process, a spike annealing process, a laser annealing process, or a millisecond annealing process, etc. In one embodiment, the second step thermal annealing process 136 is a laser annealing process or a millisecond annealing process.

The second step thermal annealing process 136 may be performed on the first doping regions, the second doping regions, the first gate dielectric layer and the second gate dielectric layer simultaneously, the thermal budget of the semiconductor device may be reduced. Further, the properties of the first gate dielectric layer and the second gate dielectric layer may be improved after the second step thermal annealing process 136. For example, the density of the first gate dielectric layer and the second gate dielectric layer may be increased. Further, comparing with the method illustrated in FIG. 1, the annealing temperature of the second step thermal annealing process 136 may be increased, the performance of the first gate dielectric layer and the second gate dielectric layer may be better than the first gate dielectric layer and the second gate dielectric layer formed by the method illustrated in FIG. 1, thus the electrical properties of the semiconductor device may be improved If a thermal annealing process is performed onto the first gate dielectric layer and the second gate dielectric layer after annealing the first doping regions and the second doping regions, in order to prevent the thermal annealing process of the first gate dielectric layer and the second gate dielectric layer from affecting the first doping regions and the second doping regions, the annealing temperature of the first gate dielectric layer (approximately 1000° C.~1100° C.) may be lower than the annealing temperature of the first doping regions and the second doping regions (1100° C.~1300° C.), thus the property improvement of the first gate dielectric layer and the second gate dielectric layer may be limited.

Returning to FIG. 13, after performing the second step thermal annealing process 136, a first gate electrode layer and a second gate electrode layer may be formed (S211). FIG. 12 illustrates a corresponding semiconductor structure.

As shown in FIG. 12, a first gate electrode layer 143 is formed on the first gate dielectric layer (on the surface of the high-K dielectric layer 135); and the first gate electrode layer 143 may fill up the first trench 133. Further, a second gate electrode layer 153 is formed on the second gate dielectric layer (on the surface of the high-K dielectric layer 135); and the second gate electrode layer 153 may fill up the second trench 134.

A process for forming the first gate electrode layer 143 and the second gate electrode layer 153 may include forming a gate electrode film (not shown) to fill up the first trench 133 and the second trench 134. The gate electrode film may also be formed on the surface of the high-K dielectric layer 135 on the surface of the interlayer dielectric layer 131. Then, the portion of the gate electrode film and the portion of the high-K dielectric layer 135 higher than the top surface of the interlayer dielectric layer 131 may be removed. Thus, the first gate electrode layer 143 may be formed in the first trench 133; and the first gate electrode layer 143 may be formed on the high-K dielectric layer 135 in the first trench 133 and fill up the first trench 133. Further, the second gate electrode layer 153 may be formed in the second trench 134; and the second gate electrode layer 153 may be formed on the high-K dielectric layer 135 in the second trench 134 and fill up the second trench 134. Thus, the first gate electrode layer 143, the high-K dielectric layer 135 in the first region I and the first sidewall spacer 102 and the second sidewall spacer 103 may form a first high-K metal gate (HKMG) structure of the PMOS transistor. The second gate electrode layer 153, the high-K dielectric layer 135 in the second region II and the first sidewall spacer 102 and the second sidewall spacer 103 in the second region may form a high-K metal gate (HKMG) structure of the NMOS transistor.

The first gate electrode layer 143 and the second gate electrode layer 153 may be made of any appropriate material, such as Al, Cu, Ag, Au, Pt, Ni, Ti, TiN, TaN, Ta, TaC, TaSiN, W, WN, or WSi, etc. Various processes may be used to form the gate electrode film, such as a CVD process, a PVD process, or a sputtering process, etc.

The top surfaces of the first gate electrode layer 143 and the second gate electrode layer 153 may level with the top surface of the interlayer dielectric layer 131. The portion of the gate electrode film and the portion of the high-K dielectric layer 135 higher the top surface of the interlayer dielectric layer 131 may be removed by any appropriate process, such as a chemical mechanical polishing process, or a physical mechanical polishing process, etc.

In one embodiment, the disclosed method may be used to form planar semiconductor devices. In certain other embodiments, the disclosed method may be used to form three-dimensional devices, such as fin field-effect transistors, etc.

Thus, a semiconductor device may be formed by the above disclosed processes and methods; and the corresponding semiconductor device is illustrated in FIG. 12. As shown in FIG. 12, the semiconductor device includes a semiconductor substrate 100 having a first regions I and a second region II; and isolation structures 101 formed in the substrate 100 between the first region I and the second region II. The semiconductor device also includes a first high-K metal gate structures having a first gate electrode layer 143, a high-K dielectric layer 135, a first sidewall spacer 102 and a second sidewall spacer 103 formed on the surface of the substrate 100 in the first region I; and a second high-K metal gate structure having a second gate electrode layer 153, the high-K dielectric layer 135, the first sidewall spacer 102 and the second sidewall spacer 103 formed on the surface of the substrate 100 in the second region II. Further, the semiconductor structure includes first stress layers 104 formed in the substrate 100 at both sides of the first high-K metal gate structure; and second stress layers 105 formed in the substrate 100 at both sides of the second high-K metal gate structure. Further, the semiconductor structure includes a contact etching stop layer 130 covering the surface of the substrate 100, the surface of the first stress layers 104, the surface of the second stress layers 105 and the side surfaces of the second sidewall spacers 103; and an interlayer dielectric layer 131 formed on the contact etching stop layer 130. Further, the method also includes a first interface layer 141 formed between the high-K dielectric layer 135 and the surface of the substrate 100 in the first region I; and a second interface layer 142 formed between the high-K dielectric layer 135 and the surface of the substrate 100 in the second region II. The detailed structures and intermediate structures are described above with respect to the fabrication processes.

Therefore, according to the disclosed method, the doping regions and the interlayer dielectric layer may be annealed simultaneously by a first step thermal annealing process; and the doping regions may be annealed for a second time with the gate dielectric layer by a second step thermal annealing process, the thermal budget of the semiconductor device may be effectively reduced. The excess diffusion of the doping ions in the doping regions caused by the process for annealing the interlayer dielectric layer may be avoided; and the excess diffusion of the doping ions in the doping region caused by the process for annealing the gate dielectric layer may also be avoided. Further, the properties of the interlayer dielectric layer and the gate dielectric layer may be improved; the etching rate of the etching process to the interlayer dielectric layer may be reduced; and the electrical properties and the reliability of the semiconductor device may be improved.

Further, the annealing temperature of the first step thermal annealing process may be relatively high, the density of the interlayer dielectric layer may be increased. Further, the annealing temperature of the second step thermal annealing process may be relatively high, thus the properties of the gate dielectric layer may be improved. Thus, the electrical properties and the reliability of the semiconductor device may be enhanced.

Further, the annealing time of the second step thermal annealing process may be greater than the annealing time of the first step thermal annealing process, the excess diffusion of the doping ions in the doping regions may be effectively prevented. Further, the annealing temperature of the second step thermal annealing process may be greater than the annealing temperature of the first step thermal annealing process, thus a significantly high activation level of the doping ions in the doping regions may be obtained after the second step thermal annealing process; and the complete activation of the doping ions in the doping regions may be ensured.

Further, the annealing temperature of the first step thermal annealing process may be in a range of approximately 1000° C.~1100° C. The temperature increasing rate may be in a range of approximately 200° C./s~300° C./s; and the temperature decreasing rate may be in a range of approximately 200° C./s~350° C./s. The total annealing time of the first step thermal annealing process may be equal to the total temperature increasing time and the total temperature decreasing time. Thus, the annealing time of the first step thermal annealing process may match the requirement for a relatively long annealing time. The first step thermal annealing process performed onto the interlayer layer dielectric layer may have a relatively long annealing time and a relatively high annealing temperature. Thus, the density of the interlayer dielectric layer may be increased and the etching rate of the etching process to the interlayer dielectric layer may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
    providing a substrate;
    forming at least one dummy gate structure on the substrate;
    forming doping regions in the substrate at both sides of the dummy gate structure;
    forming an interlayer dielectric film on the substrate, on a side surface of the dummy gate structure, and having a top surface above the dummy gate structure;
    performing a first step thermal annealing process onto the interlayer dielectric film and the doping regions;
    after the first step thermal annealing process, removing a portion of the annealed interlayer dielectric film to form an interlayer dielectric layer;
    removing the dummy gate structure to expose a surface portion of the substrate to form a trench in the interlayer dielectric layer;
    forming a gate dielectric layer on the surface portion of the substrate and on a bottom of the trench; and
    performing a second step thermal annealing process onto the gate dielectric layer and the doping regions to further activate doping ions in the doping regions and increase a density of the gate dielectric layer.

2. The method according to claim 1, wherein:
    annealing time of the first step thermal annealing process is less than annealing time of the second step thermal annealing process; and
    an annealing temperature of the first step thermal annealing process is less than an annealing temperature of the second thermal annealing process.

3. The method according to claim 2, wherein:
    the annealing temperature of the first step thermal annealing process is in a range of approximately 1000° C.~1100° C.;

a temperature increasing rate of the first step thermal annealing process is in a range of approximately 200° C./s~300° C./s;

a temperature decreasing time of the first step thermal annealing process is in a range of approximately 200° C./s~350° C.;

the annealing temperature of the second step thermal annealing process is in a range of approximately 1100° C.~1300° C.; and the annealing time of the second thermal annealing time is in a range of approximately 0.05 ms~10 ms.

4. The method according to claim 1, wherein:
the interlayer dielectric layer is formed by a flowable chemical vapor deposition process or a high aspect ratio chemical vapor deposition (HARP CVD) process.

5. The method according to claim 4, wherein:
a reaction gas of the HARP CVD process includes a silicon source gas and an oxygen source gas;
a flow rate of the silicon source gas is in a range of approximately 20 sccm~2000 sccm;
a flow rate of the oxygen source gas is in a range of approximately 10 sccm~1000 sccm;
pressure of a reaction chamber of the HARP CVD process is in a range of approximately 1 mTorr~50 Torr; and
a temperature of the reaction chamber of the HARP CVD process is in a range of approximately 450° C.~800° C.

6. The method according to claim 1, wherein forming the interlayer dielectric film further includes:
forming a contact etching stop layer to cover the substrate and the dummy gate structure; and
forming the interlayer dielectric film on the contact etching stop layer.

7. The method according to claim 1, after performing the second step thermal annealing process onto the gate dielectric layer and the doping regions, further including:
forming a gate electrode layer on the gate dielectric layer to fill up the trench.

8. The method according to claim 1, before forming the doping regions, further including:
forming sidewall spacers on side surfaces of the dummy gate structure;
forming trenches in the substrate at both sides of the dummy gate structure; and
forming stress layers by filling up the trenches using a selective epitaxial growth process.

9. The method according to claim 8, wherein:
the stress layers are made of SiGe, SiC, SiGeB, or SiCP.

10. The method according to claim 9, wherein:
the stress layers are made of SiGeB; and
a concentration of B is in a range of approximately 1E18 atom/cm$^3$~3E20 atom/cm$^3$.

11. The method according to claim 9, wherein:
the stress layers are made of SiCP; and
a concentration of P is in a range of approximately 1E15 atom/cm$^3$~5E18 atom/cm$^3$.

12. The method according to claim 1, wherein:
the gate dielectric layer includes an interface layer formed on the surface of substrate on the bottom of the trench and a high-K dielectric layer formed on a top surface of the interface layer and side surfaces of the trench.

13. The method according to claim 12, wherein the high-K dielectric layer is made of LaO, AlO, BaZrO, HfSiO, HfZrON, HfLaO, HfSiON, LaSiO, AlSiO, HfTaO, HfTiO, Al$_2$O$_3$, Si$_3$N$_4$, or BaSrTiO$_4$.

14. The method according to claim 7, wherein:
the gate electrode layer is made of Al, Cu, Ag, Au, Pt, Ni, Ti, TiN, TaN, Ta, TaC, TaSiN, W, WN, or WSi.

15. The method according to claim 1, wherein:
the semiconductor device is a planar semiconductor structure.

16. The method according to claim 1, wherein the first step thermal annealing process performed onto the interlayer dielectric layer and the doping regions increases density of the interlayer dielectric layer and activate doping ions in the doping regions for the first time without an excess diffusion of the doping ions in the doping regions.

17. The method according to claim 6, wherein removing the portion of the annealed interlayer dielectric film to form the interlayer dielectric layer includes:
removing the portion of interlayer layer dielectric film and a portion the contact etching stop layer that are above a top surface of the dummy gate structure to form the interlayer dielectric layer having a top surface coplanar with the top surface of the dummy gate structure.

18. The method according to claim 6, wherein:
the contact etching stop layer is made of SiN, SiON, SiOBN, or SiOCN;
the contact etching stop layer is formed by a thermal oxidation process, a chemical vapor deposition process, or an atomic layer deposition process; and
a thickness of the contact etching stop layer is in a range of approximately 10 Å~200 Å.

19. The method according to claim 1, wherein:
the interlayer dielectric layer has a top surface coplanar with the dummy gate structure.

* * * * *